(12) United States Patent
Zommer

(10) Patent No.: US 8,716,864 B2
(45) Date of Patent: May 6, 2014

(54) SOLDERLESS DIE ATTACH TO A DIRECT BONDED ALUMINUM SUBSTRATE

(75) Inventor: Nathan Zommer, Fort Lauderdale, FL (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 13/490,459

(22) Filed: Jun. 7, 2012

(65) Prior Publication Data

US 2013/0328204 A1     Dec. 12, 2013

(51) Int. Cl.
    *H01L 29/72*        (2006.01)

(52) U.S. Cl.
    USPC .......... 257/765; 257/E23.141; 228/101; 228/203; 228/205; 228/248.1

(58) Field of Classification Search
    USPC .......... 257/765, E23.141; 228/101, 203, 205, 228/248.1
See application file for complete search history.

(56) References Cited

U.S. PATENT DOCUMENTS

| | | | |
|---|---|---|---|
| 6,404,065 B1 | 6/2002 | Choi | 257/782 |
| 6,798,060 B2 | 9/2004 | Strauch | 257/705 |
| 7,005,734 B2 | 2/2006 | Choi et al. | 257/686 |
| 2006/0220216 A1* | 10/2006 | Mizuno et al. | 257/691 |
| 2011/0075451 A1* | 3/2011 | Bayerer et al. | 363/37 |
| 2012/0055707 A1 | 3/2012 | Schafer et al. | 174/260 |
| 2013/0049204 A1* | 2/2013 | Oeschler et al. | 257/772 |

OTHER PUBLICATIONS

Morita et al., "Direct Bonding to Aluminum with Silver-Oxide Micropartides," Materials Transactions, vol. 50, No. 1 (2009) Aug. 18, 2008 pp. 226-228, (3 pages).
MAgic Sinter Products (webpage), Heraeus Materials Technology, downloaded from http://heraeus-contactmaterials.de/en/products/sinterpastes/sinterpastes.aspx on Jun. 4, 2012 (1 page).

* cited by examiner

*Primary Examiner* — Edward Wojciechowicz
(74) *Attorney, Agent, or Firm* — Imperium Patent Works; T. Lester Wallace; Darien K. Wallace

(57) ABSTRACT

A DBA-based power device includes a DBA (Direct Bonded Aluminum) substrate. An amount of silver nanoparticle paste of a desired shape and size is deposited (for example by micro-jet deposition) onto a metal plate of the DBA. The paste is then sintered, thereby forming a sintered silver feature that is in electrical contact with an aluminum plate of the DBA. The DBA is bonded (for example, is ultrasonically welded) to a lead of a leadframe. Silver is deposited onto the wafer back side and the wafer is singulated into dice. In a solderless silver-to-silver die attach process, the silvered back side of a die is pressed down onto the sintered silver feature on the top side of the DBA. At an appropriate temperature and pressure, the silver of the die fuses to the sintered silver of the DBA. After wirebonding, encapsulation and lead trimming, the DBA-based power device is completed.

21 Claims, 13 Drawing Sheets

CROSS-SECTION OF ONE DBA

CERAMIC PANEL

ATTACH ALUMINUM PLATES

PATTERN AND ETCH ALUMINUM

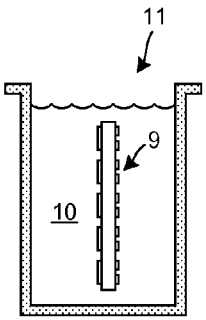

CLEAN NATIVE OXIDE OFF
OF ALUMINUM

FIG. 4

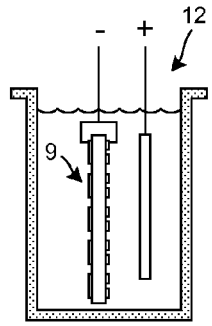

PLATE A METAL SUCH AS NICKEL OR
PALLADIUM ONTO CLEANED
ALUMINUM SURFACES
(THERE ARE OTHER WAYS TO DO
THIS PLATING)

FIG. 5

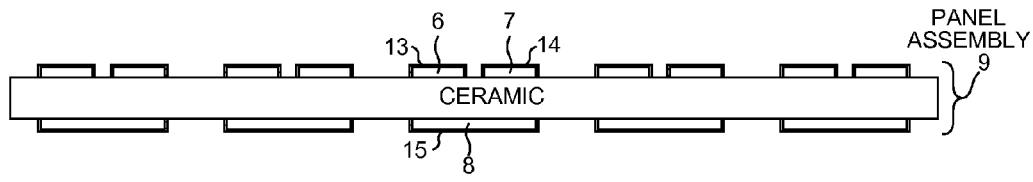

CROSS-SECTION OF PLATED PANEL

FIG. 6

| CONSTITUENT | | WEIGHT PERCENT |
|---|---|---|
| SILVER NANOPARTICLES | SILVER | 88% |
| | ~ 8-12 nm DIAMETER | |
| | SINTER TEMP = 250°C w/ no pressure | |
| DISPERSANT / BINDER | FATTY ACID SUCH AS STEARIC ACID | 2% |
| | BURNOUT TEMP = 200°C | |
| SOLVENT (THINNER) | TERPINEOL | 10% |

CONSTITUENTS OF THE SILVER NANOPARTICLE PASTE

FIG. 7

SCREEN PRINT SILVER NANOPARTICLE PASTE ONTO METAL-PLATED ALUMINUM ISLANDS (CROSS-SECTIONAL VIEW)

DETAIL OF SILVER NANOPARTICLE PASTE BEFORE SINTERING

DETAIL OF THE SINTERING OPERATION

DETAIL OF THE RESULTING SILVER
FEATURE AFTER SINTERING

SECTION PANEL ASSEMBLY
INTO MANY DBAs

CROSS-SECTION OF ONE DBA

SOLDERLESS SILVER-TO-SILVER DIE ATTACH

CIRCUIT DIAGRAM

**FIRST EMBODIMENT
(SINTERED SILVER ON METAL-PLATED ALUMINUM)**

SECOND EMBODIMENT
(SILVER NANOPARTICLE PASTE DEPOSITED ONTO ALUMINUM OXIDE)

| CONSTITUENT | | WEIGHT PERCENT |
|---|---|---|
| SILVER NANOPARTICLES | SILVER<br>~ 8-12 nm DIAMETER<br>SINTER TEMP = 250°C w/ no pressure | 86% |
| DISPERSANT / BINDER | FATTY ACID SUCH AS STEARIC ACID<br>BURNOUT TEMP = 200°C | 2% |
| SOLVENT (THINNER) | TERPINEOL | 10% |
| FLUX | A SALT OF A FLUORINE-CONTAINING ACID SUCH AS HEXAFLUOROSILIC ACID | 2% |

CONSTITUENTS OF A SILVER NANOPARTICLE PASTE FOR THE SECOND EMBODIMENT

FIG. 20

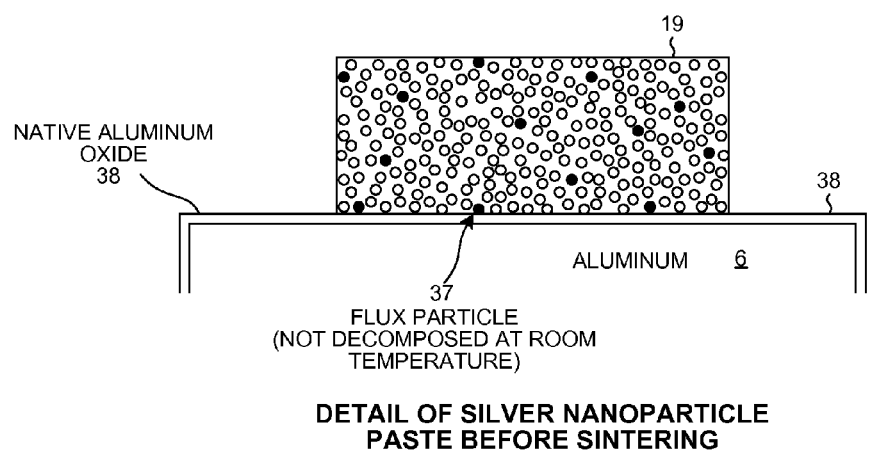

DETAIL OF SILVER NANOPARTICLE PASTE BEFORE SINTERING

FIG. 21

DETAIL OF THE SINTERING OPERATION

DETAIL OF THE RESULTING SILVER FEATURE AFTER SINTERING

THIRD EMBODIMENT
(SILVER NANOPARTICLE PASTE DEPOSITED ONTO
MECHANICALLY CLEANED ALUMINUM)

SOLDERLESS DIE ATTACH TO A DIRECT BONDED ALUMINUM SUBSTRATE

TECHNICAL FIELD

The described embodiments relate to DBA-based power devices.

BACKGROUND INFORMATION

Direct-Bonded Copper (DBC) substrates (also called Direct Copper Bonded (DCB) substrates) are used extensively in the power semiconductor industry. A DBC substrate generally includes a thick ceramic substrate member, to which a thinner top plate of copper and a thinner bottom plate of copper are bonded. A semiconductor die includes one or more power devices such as, for example, power transistors and/or power diodes. Metallization on the back side of this semiconductor die is soldered to the top copper plate of the DBC. The DBC is often physically secured by soldering or welding the top copper plate to a package lead. Bond pads on the front side surface of the die are typically wirebonded to other package leads. The resulting assembly is then encapsulated. After lead trimming, ends of the leads protrude from the encapsulant. To improve conduction of heat from the package, the encapsulant is made not to cover the bottom surface of the bottom copper plate. This exposed surface of the DBC facilitates heat escaping from the package. The exposed surface may, for example, be placed in good thermal contact with an external heat sink. For additional background information on DBC substrates and packaged power devices that include DBC substrates, see U.S. Pat. No. 6,404,065.

Although DBC-based power devices work well in many applications, other applications involve thermal cycling over wider temperature ranges and to higher temperatures. In such applications, differential thermal expansion between the DBC ceramic and copper may result in cracking of the ceramic or in separation at the ceramic-to-copper interface. Accordingly, a metal bonded ceramic substrate referred to as a DBA (Direct-Bonded Aluminum) substrate has been developed. DBA substrates are sometimes called Direct Aluminum Bonded (DAB) substrates. Rather than direct bonding copper plates onto ceramic as in the case of a DBC substrate as described above, aluminum plates are direct bonded onto ceramic. Aluminum is a softer and more ductile metal than copper. Aluminum has a lower crystal hardness modulus than copper. As a result of being softer, the aluminum conforms with less stress to the expansion and contraction of the alumina ceramic substrate. Thus DBA substrates generally provide better resistance to cracking and lift off failures under severe thermal power cycling.

Aluminum is not, however, a readily solderable metal. The top surface of the top side aluminum plate of the DBA is therefore provided with a thin layer of a solderable metal (for example, copper, or nickel, or silver, or gold). This thin layer of solderable metal allows a metalized back side of a semiconductor die to be soldered to the upper surface of the top aluminum plate of the DBA. As in the case of DBC-based packages, bond pads on the front side of the die are wirebonded to package leads. Encapsulation and lead trimming are then carried out. For additional background information on DBA substrates and on packaged power devices that include DBA substrates, see: U.S. Pat. No. 6,798,060 and U.S. Pat. No. 7,005,734.

In even more severe temperature cycling applications, DBA-based power semiconductor devices have been noticed to fail. Further improvements in direct metal bonded semiconductor packages are sought.

SUMMARY

A DBA-based power device includes a DBA (Direct Bonded Aluminum) substrate. To make the DBA substrate, silver nanoparticle paste is deposited onto a top side metal plate of a DBA panel assembly structure. The silver nanoparticle paste is sintered to form a sintered silver feature (also called a sintered silver structure or a sintered silver layer). The resulting DBA panel assembly is cut into individual DBA substrates. A DBA substrate is then physically attached (for example, is ultrasonically welded) to a lead of a leadframe.

Silver is deposited onto the back side surface of a wafer (for example, by evaporative deposition). The wafer is then singulated into a plurality of semiconductor die. Each of the semiconductor dice therefore has a silvered back side surface.

In a solderless silver-to-silver die attach process, the silvered back side surface of one of the semiconductor dice is pressed down onto a corresponding sintered silver feature on the top side of one of the DBA substrates. At an appropriate temperature and under an appropriate pressure, the silver layer of the semiconductor die fuses to the sintered silver layer of the DBA substrate. Bond pads on the face side of the semiconductor die are then wirebonded to corresponding other leads of the leadframe as appropriate. The DBA portion of the leadframe assembly is then encapsulated with injection molded plastic. The leads are cut from the leadframe resulting in the completed DBA-based power device.

In a first example, aluminum islands on the top side of the DBA panel assembly are plated with another metal or metals (for example, nickel or palladium). Silver nanoparticle paste is deposited onto this layer of plating metal. The nanoparticle paste is then sintered so that the resulting sintered silver features are disposed on the metal plating layer. The metal plating layer may be a fifty micron thick layer of nickel or palladium plating on the aluminum islands on the top side of the DBA panel assembly. The plating metal can be part of a multilayer plate involving an aluminum layer, so that both the aluminum and the plating layer are attached to the ceramic substrate of the DBA panel assembly at the time of direct bonding. The plating metal can also be applied onto an already patterned aluminum layer of the DBA panel assembly. Regardless of which way is used to provide the thin metal plating layer, in the final DBA-based power device there is a metal plating layer disposed underneath each sintered silver feature between the sintered silver feature and the underlying aluminum island of the DBA substrate.

In a second example, there is no other layer of metal plating on the aluminum islands on the top side of the DBA panel assembly. Rather, the silver nanoparticle paste is deposited onto a thin native aluminum oxide on the aluminum islands, and sintering is carried out such that the resulting sintered silver features are disposed on the aluminum islands without there being any intervening other metal being between the sintered silver and the aluminum of the islands. In one example, the silver nanoparticle paste includes particles of a flux material. In one example, the flux particles are a salt of hexafluorosilic acid. The flux particles decompose at elevated temperatures forming reactive agents such as an acid. During the sintering process, these reactive agents help penetrate the native aluminum oxide under the nanoparticle paste. Ultrasonic energy may be applied to assist in cracking the native aluminum oxide. At elevated temperatures later in the sintering process, the flux residue and other organics are burned out of the sintering material. For information on the burning off of fatty acid dispersant/binder, see: U.S. Patent Application Publication US2012/0055707, to Schafer et al. (the subject matter of which is incorporated herein by reference). Accordingly, in the final DBA-based power device, there is either no native aluminum oxide or there is only a penetrated native aluminum oxide layer disposed between a sintered silver feature and the underlying aluminum island of the DBA substrate.

In a third example, there is no other layer of metal plating on the aluminum islands on the top side of the DBA panel assembly. Any native oxide on localized areas on top surfaces of the aluminum islands is mechanically removed. In one example, the thin layer of aluminum oxide on one such localized area is mechanically removed by using a micro-nozzle to blast a stream of small abrasive particles at the localized area. This blasting is done in an atmosphere substantially devoid of oxygen and devoid of moisture. The spent abrasive particles and any resulting debris are removed by an accompanying vacuum nozzle. The blasting mechanically removes aluminum oxide that may have grown on the localized area. After this mechanical cleaning step, silver nanoparticle paste is micro-jetted onto the cleaned aluminum surface using another micro-jet nozzle. Each localized area on an aluminum island that is to bear a sintered silver feature is cleaned and then deposited with silver nanoparticle paste in this way. The DBA panel assembly remains in an oxygen free environment between the cleaning step and the depositing of paste step, so aluminum oxide cannot regrow on the cleaned aluminum surface before the depositing step takes place. Sintering is then carried out on the entire panel assembly, thereby forming the desired sintered silver features. The DBA panel assembly is then cut to form individual DBA substrates. Accordingly, in the final DBA-based power device, there is no native aluminum oxide disposed between a sintered silver feature and the underlying aluminum island of the DBA substrate.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 4 is an illustration of a step of cleaning native aluminum oxide from the aluminum surfaces of the panel.

FIG. 5 is an illustration of plating a metal onto the cleaned aluminum surfaces of the panel.

FIG. 6 is a cross-sectional diagram of the plated panel assembly.

FIG. 7 is a table that sets forth the constituents of a silver nanoparticle paste.

FIG. 20 is a table that sets forth the constituents of a silver nanoparticle paste used in one example of the method of FIG. 19.

FIG. 21 is a simplified cross-sectional diagram of a volume of deposited silver nanoparticle paste prior to sintering in one example of the method of FIG. 19.

DETAILED DESCRIPTION

Reference will now be made in detail to some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "front", "back", "top" and "bottom" are used herein to describe relative orientations between different parts of the structure being described, and it is to be understood that the overall structure being described can actually be oriented in any way in three-dimensional space.

Figure 16:
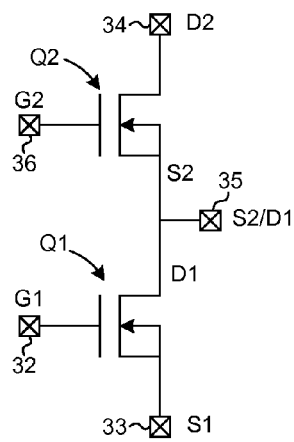
FIG. 16 is a circuit diagram of the power device structure.
Figure 17:
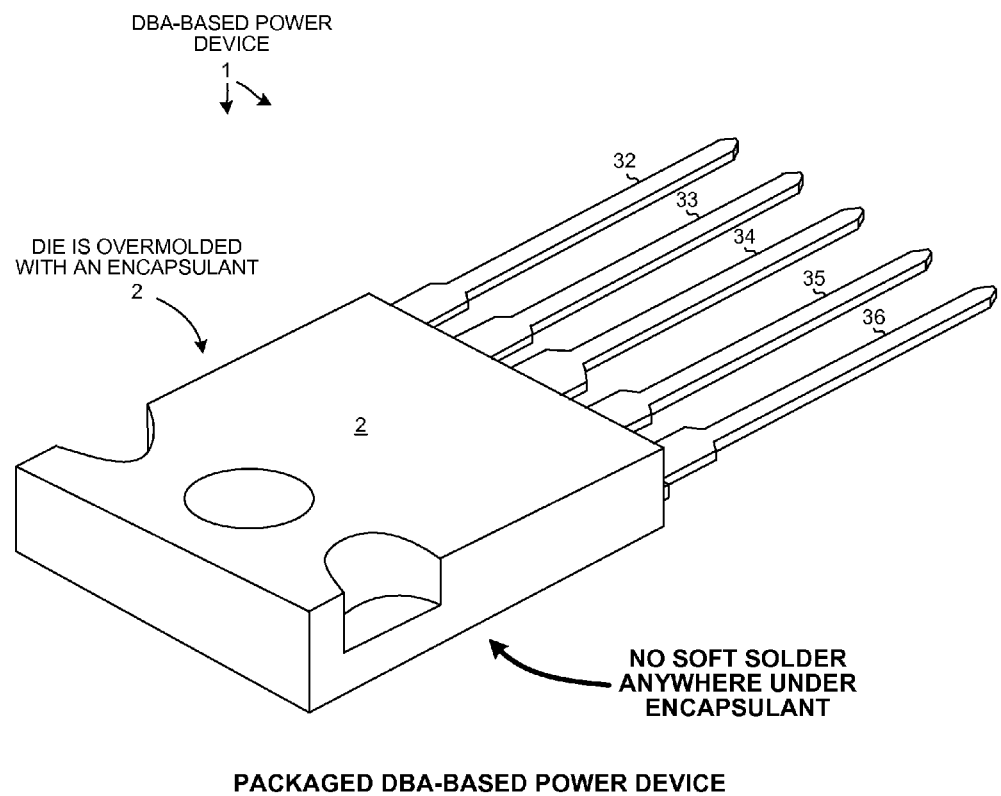
FIG. 17 is a perspective diagram of the packaged DBA-based power device.

FIGS. 1-18 set forth a method of making a novel DBA-based power device 1 as illustrated in FIG. 17. The DBA-based power device 1 includes no soft solder disposed anywhere under the block of encapsulant 2 of the device. "Soft solders" melt at a temperature lower than 450° C., and typically contain lead, tin, antimony or a combination of these. Rather than employing a soft solder for die attach, features of sintered silver are formed on a top side aluminum plate of a DBA within the package, and a silver surface on the back side of a semiconductor die is die-attached directly to the sintered silver feature without any intervening soft solder. Bond pads on the top side of the die are wirebonded via aluminum bond wires to leads of the package. Accordingly there are no soft solder connections in packaged power device 1. Thermal fatigue failures that would otherwise occur as a result of severe temperature cycling and high temperatures were soft solder used for die attach are avoided due to the solderless, silver-to-silver die attach process used.

Figure 1:
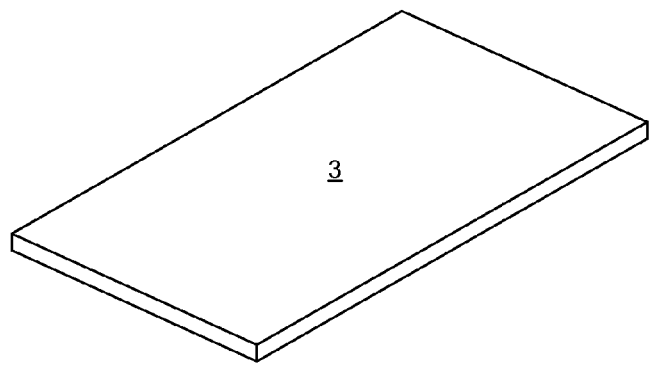
FIG. 1 is a perspective diagram of a ceramic panel.

FIG. 1 is a simplified perspective view of a panel 3 of a ceramic material. The ceramic material may, for example, be alumina (Al2O3) or aluminum nitride (AlN). The ceramic panel may, for example, measure approximately 5.6 inches by approximately 7.7 inches, and may be 0.63 mm thick.

Figure 2:
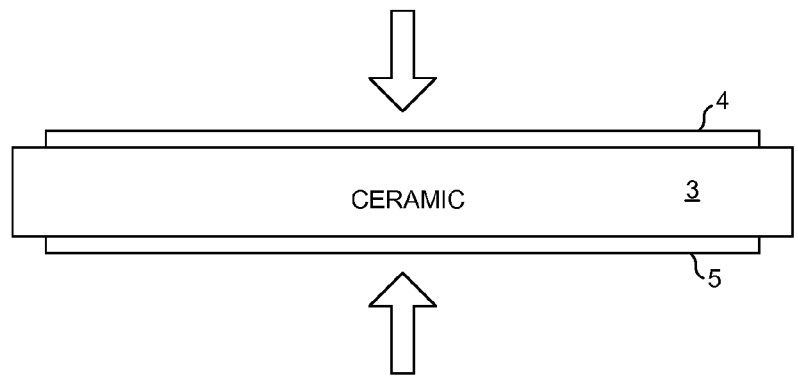
FIG. 2 is a cross-sectional diagram of the direct bonding of aluminum plates to the ceramic panel of FIG. 1.

FIG. 2 illustrates a step of direct bonding a first plate 4 (also called a "front side plate" or a "die side plate") of aluminum and a second plate 5 (also called a "back side plate") of aluminum to the ceramic panel 3 of FIG. 1. In one example, the bottom side of the top side plate 4 includes a layer of Al—Si alloy. The entire plate 4, including the Al—Si layer, may be 0.30 mm thick. Also, the top side of the bottom side plate 5 similarly includes a layer of Al—Si. The entire plate 5, including the Al—Si layer, may be 0.30 mm thick. Al—Si has a lower melting point than pure aluminum, thereby enabling the direct bonding process to be conducted at a lower temperature than the melting point of aluminum. The two aluminum plates 4 and 5 are pressed into the ceramic panel 3 with a weight of at least 200 g at a temperature of in excess of 700° C. for a period of about one minute in an inert atmosphere of nitrogen. For further details on the attachment of aluminum plates 4 and 5 to ceramic panel 3, and for further details on direct metal bonded substrates, see: U.S. Pat. No. 6,798,060, U.S. Pat. No. 7,005,734, and U.S. Pat. No. 6,404,065 (the subject matter of these three patent documents is incorporated herein by reference).

Figure 3:
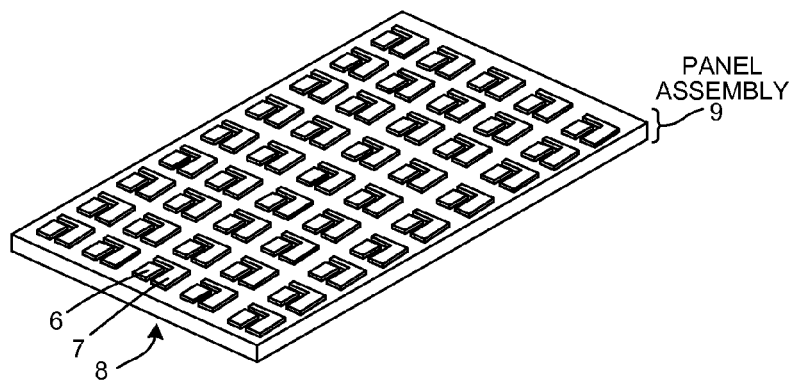
FIG. 3 is a perspective diagram of the ceramic panel after patterning and etching of the aluminum plates.

FIG. 3 illustrates a subsequent step of patterning and etching the aluminum plates 4 and 5. After patterning using photoresist and a standard photolithographic process, each plate is etched. $FeCl_3$ based chemistry or $CuCl_2$ based chemistry may be used. Etching may leave some residue of the AlSi alloy. This residue is removed using a mixture of nitric acid, hydrofluoric acid and acetic acid. The result of the patterning and etching is a plurality of aluminum islands on the top side of ceramic panel 3, and a plurality of aluminum islands on the bottom side of ceramic panel 3. In the diagram of 3, reference numerals 6 and 7 identify two of the islands on the top side of the resulting panel assembly 9. The corresponding island 8 on the bottom side of panel assembly 9 is not seen in the perspective of FIG. 3.

FIG. 4 illustrates a subsequent step 11 of cleaning the panel assembly 9 to remove a native aluminum oxide that develops on the aluminum surfaces. After the patterning and etching of the aluminum has been carried out, and panel assembly is generally handled in an air atmosphere. As a consequence of being exposed to air, any exposed aluminum surfaces quickly develop a native aluminum oxide. The cleaning step of FIG. 4 removes this native aluminum oxide. In the illustrated example, the panel is immersed in a strong alkaline solution 10 of NaOH, followed by a zinc based treatment.

FIG. 5 illustrates a subsequent step 12 of plating a metal onto the cleaned aluminum surfaces. Once the native aluminum oxide has been removed as illustrated in FIG. 4, all exposed aluminum surfaces are immediately plated with a metal such as nickel or palladium. An electroplating process 11 may be used as illustrated in FIG. 5. The resulting plating metal layers on the aluminum islands are about five microns thick. Alternatively, an electroless nickel plating process may be used in which case the nickel layer may include about eight percent phosphorous. Alternatively, an electroless palladium plating process may be used.

FIG. 6 is a simplified cross-sectional diagram of DBA 9 after the metal plating step of FIG. 5 has been performed. Metal layer 13 plates aluminum island 6. Metal layer 14 plates aluminum island 7. Metal layer 15 plates aluminum island 8.

FIG. 7 is a table that sets forth the constituents of a silver nanoparticle paste. The listed weight percentages and temperatures are approximate.

Figure 8:
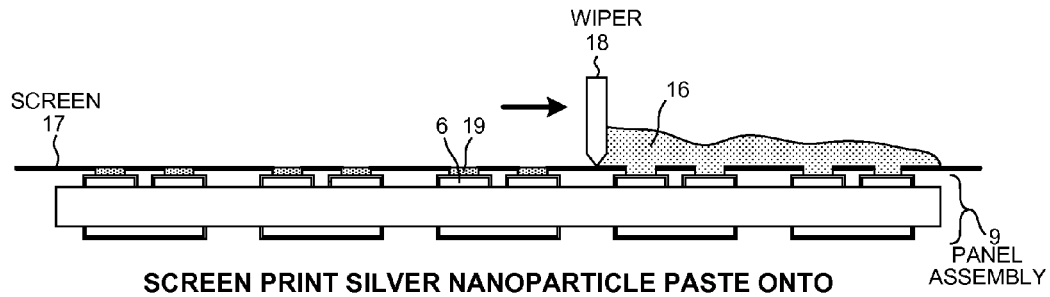
FIG. 8 is an illustration of the silver nanoparticle paste of FIG. 7 being deposited onto islands of the panel assembly.

FIG. 8 illustrates a step of depositing volumes of the silver nanoparticle paste 16 of FIG. 7 onto selected regions of the metal-plated aluminum islands on the top side of the panel assembly 9. Alternatively, where the metal layers 13 and 14 are palladium, the silver nanoparticle paste may be an mAgic Paste Microbond paste, series ASP016, ASP043, ASP131 or APA859, that is commercially available from Heraeus Materials Technology GmbH & Co. KG of Hanau, Germany. A screen printing process using a patterned screen 17 and a wiper 18 may be used. The patterned screen 17 has openings where corresponding volumes of silver nanoparticle paste are to be deposited. In another example, the silver nanoparticle paste may be ink-jetted onto the panel assembly or may be sprayed.

Figure 9:
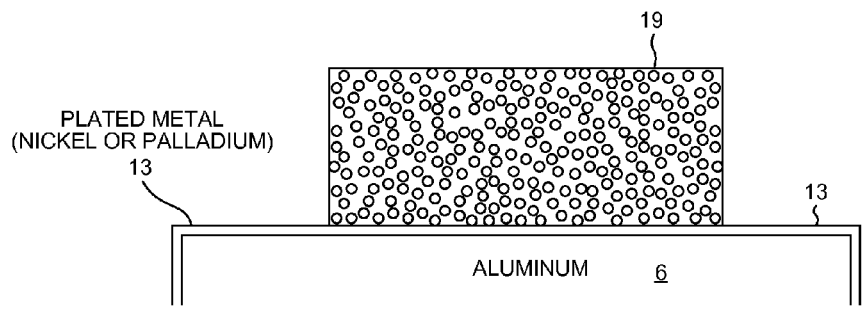
FIG. 9 is a simplified cross-sectional diagram of a volume of deposited silver nanoparticle paste prior to sintering.

FIG. 9 is a cross-sectional diagram of one volume 19 of the silver nanoparticle paste after the screen 17 of FIG. 8 has been removed and before sintering. The circles in FIG. 9 represent particles of silver. Each silver nanoparticle is coated with the dispersant/binder. The dispersant/binder and the thinner of the paste serve to keep the silver particles evenly dispersed in the paste volume. The diagram is not to scale but rather is schematically shown to better illustrate the sintering process.

Figure 10:
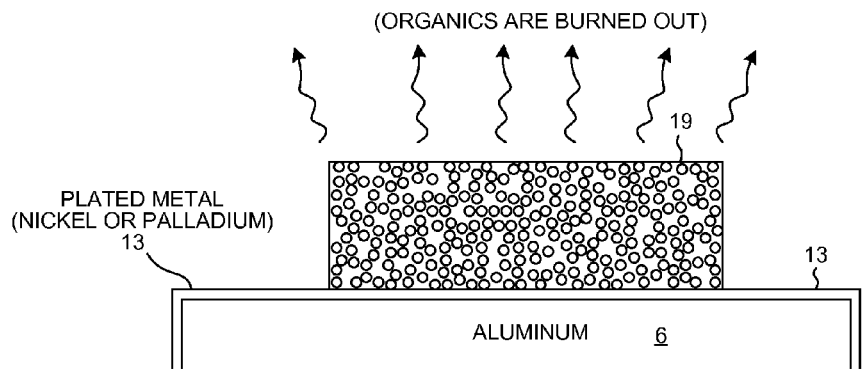
FIG. 10 is an illustration of the sintering of the volume of paste of FIG. 9.

FIG. 10 is a cross-sectional diagram that illustrates the volume 19 midway through the sintering process. As the temperature increases to about 150° C., the thinner evaporates. This results in a somewhat more dense packing of the nanoparticles as illustrated. Once the thinner has evaporated, the temperature is increased further to approximately 200° C. The type of dispersant/binder is selected so that the dispersant/binder coating separates from the silver particles and burns out at this 200° C. elevated temperature, but before actual sintering takes place at a higher sintering temperature of 250° C. Generally the dispersant and the binder involve organic molecules involving carbon chains of twelve or more carbon atoms, whereas the thinner is an organic molecule that has carbon chains of approximately three carbon atoms. Before burning off, these and/or other constituents of the paste may decompose to form reactive compounds and acids. These reactive compounds and acids assist in penetrating, cleaning and/or removing oxides from the surface upon which the paste is disposed.

After burn out of the organic compounds, the temperature is increased to the higher sintering temperature of 250° C. The sintering 250° C. temperature causes the silver nanoparticles to densify and to sinter together. The sintering temperature depends on the size of the nanoparticles and the compaction pressure applied during sintering. In the present example, no compaction pressure is applied.

Figure 11:
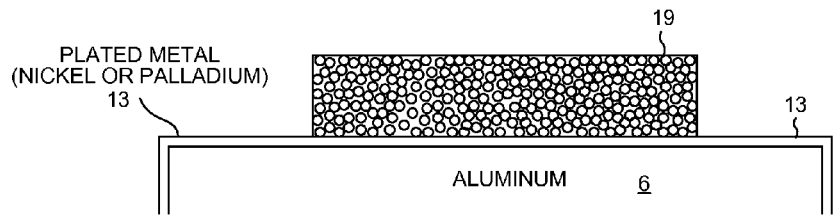
FIG. 11 is a simplified cross-sectional diagram of the sintered silver feature that results from the sintering of the volume of paste of FIG. 9.

FIG. 11 is a cross-sectional diagram of a resulting sintered silver feature. There is good electrical contact between the silver of the sintered feature and the unoxidized aluminum of the underlying aluminum island 6. This electrical connection exists through metal plate layer 13. The sintered silver feature is also mechanically bonded to metal plate layer 13. The precise manner of mechanical bonding is not fully understood, but it is believed that some of the small silver nanoparticles in their presintered state fit down into small cracks and imperfections in metal plate layer 13. These embedded particles are then sintered in place so that they are bonded to one another and to other nanoparticles of the larger sintered feature above. Due to these sintered extensions that are anchored into the cracks in metal plate layer 13, the resulting monolithic sintered feature grasps and is bonded to metal plate layer 13.

Figure 12:
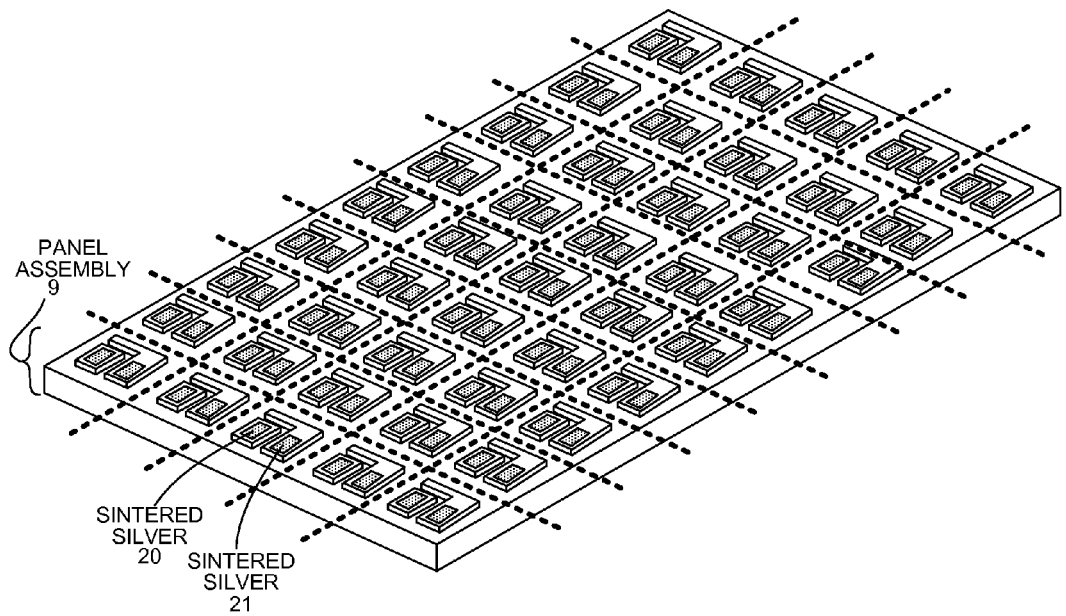
FIG. 12 is a perspective diagram of the panel assembly after the sintering process has been completed.

FIG. 12 is a perspective view of panel assembly 9 after sintering. A sintered silver feature is disposed on each corresponding metal-plated aluminum island on the top side of the panel. Reference numeral 20 identifies the sintered silver feature disposed on aluminum island 6. Reference numeral 21 identifies the sintered silver feature disposed on aluminum island 7. The dashed lines in FIG. 12 indicate where the panel assembly 9 will be cut to form individual DBAs.

Figure 13:
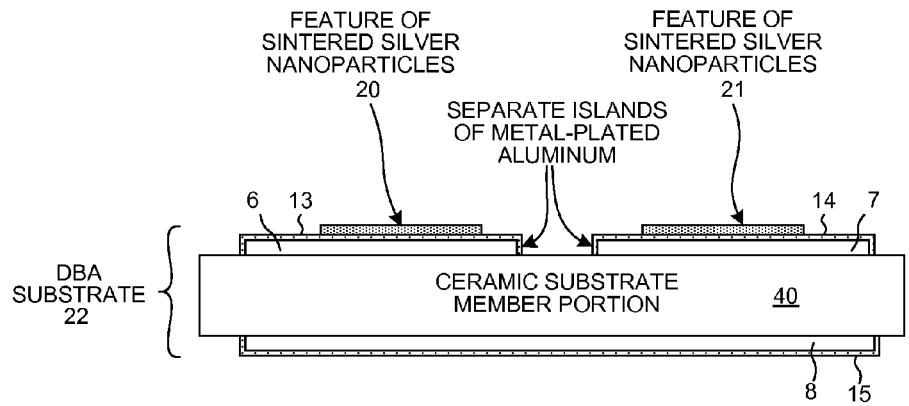
FIG. 13 is a cross-sectional diagram of one of the DBAs that is cut from the panel of FIG. 12.

FIG. 13 is a cross-sectional diagram of one DBA substrate 22 after the DBA substrate has been cut from the panel assembly 9 of FIG. 12. The DBA substrate 22 may, for example, have a width of 14.2 mm and a length of 17.0 mm. In this example, there are two metal-plated aluminum islands 6 and 7 on the top side of ceramic substrate member portion 40. There is one metal-plated aluminum island 8 on the bottom side of the ceramic substrate member portion 40.

Next, a row of ten DBA substrates is welded simultaneously to corresponding leads of a suitable leadframe. The leads of the leadframe, prior to their being trimmed and separated into individual leads, are made to extend toward the row of DBA substrates. For each DBA substrate, one corresponding center lead of the leadframe is physically attached to the top side metal of the DBA substrate. In the present example, these center leads are ultrasonically welded under pressure to the top side plates of corresponding DBA substrates.

Figure 14:
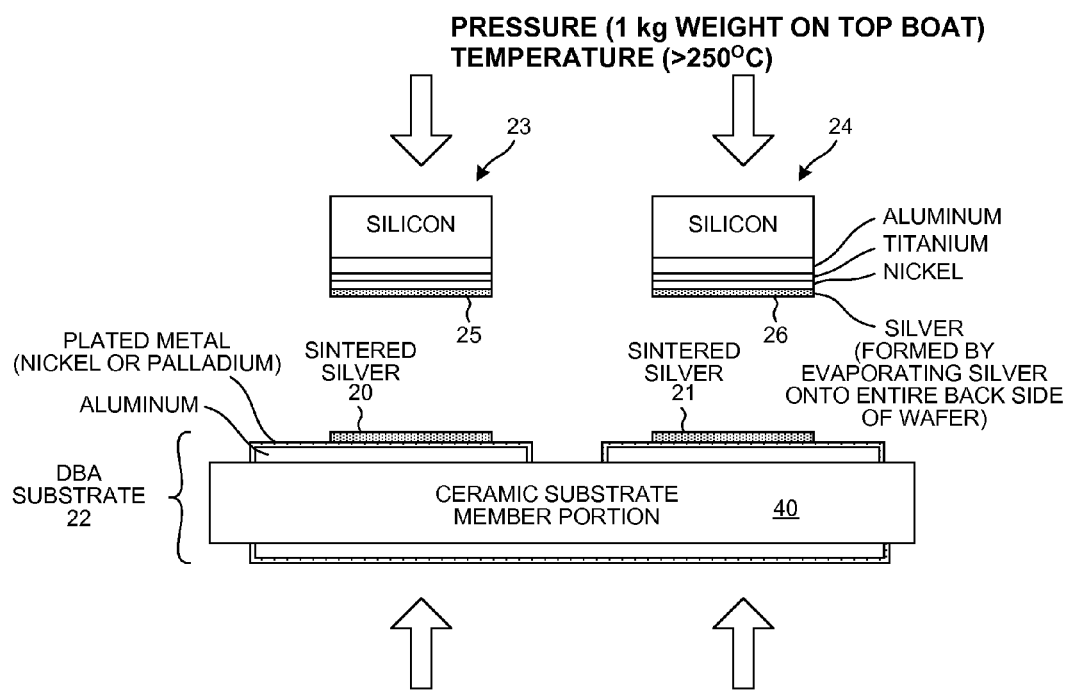
FIG. 14 is an illustration of two semiconductor dice being die attached to sintered silver features on the top side of the DBA of FIG. 13.

FIG. 14 illustrates a subsequent step of performing direct silver-to-silver die attach bonding. The back side of a single wafer is plated with aluminum, then titanium, then nickel, and finally silver. The silver is deposited onto the back side of the wafer using an evaporative process. The silvered wafer is then cut into individual dice. Semiconductor dice 23 and 24 are two dice cut from this wafer. Reference numerals 25 and 26 identify back side surface silver layers that are formed by evaporation. A top boat (not shown) made of graphite is fashioned with recesses to accommodate ten pairs of dice. The dice fit into the recesses in the top boat with their silvered back side surfaces facing up. A bottom boat (not shown) made of graphite is fashioned with recesses to accommodate the leadframe and its ten attached DBA substrates. The DBA substrates fit into recesses in the bottom boat with their sintered silver features facing upward. The two boats are then brought together so that the silvered back sides of the dice register with corresponding silver portions of the DBA substrates. The top boat is pressed downward under a weight of at least one kilogram at a temperature of 250° C. The pressure and temperature causes direct silver-to-silver die attach bonding to occur between the silver back side surfaces of the dice and the sintered silver surfaces of the DBA substrates. Die attach is performed in this way on a row of ten DBA substrates (that are all attached to one leadframe) at one time due to the bottom boat accommodating a leadframe with ten attached DBA substrates.

Figure 15:
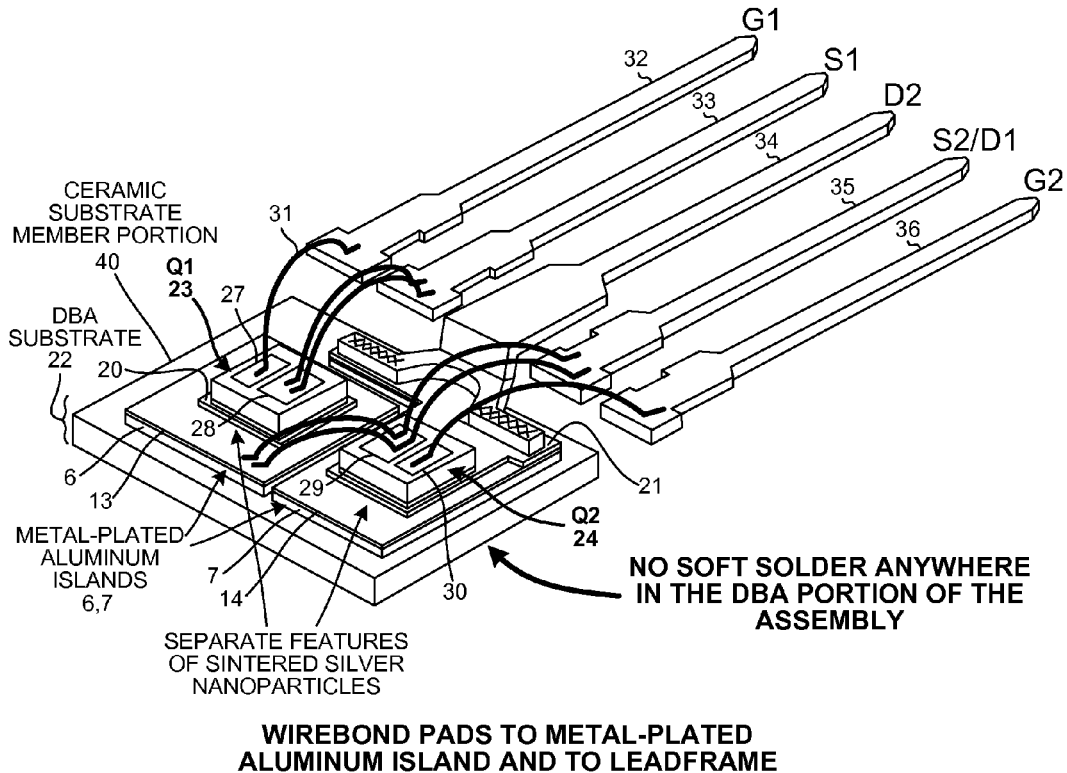
FIG. 15 is a simplified perspective diagram that illustrates the wirebonded power device structure.

FIG. 15 is a simplified perspective view that shows the result of a subsequent wirebonding step. Bond pads 27-30 on the top sides of the dice 23 and 24 are wirebonded via pure aluminum bond wires to various ones of the ends of the leads of the leadframe. Reference numeral 31 identifies one such bond wire. In addition, aluminum bond wires are provided to extend from bond pad 29 to the nickel or palladium plated surface of island 6. Although only one set of leads 32-36 and one DBA substrate 22 is illustrated in FIG. 15, wirebonding is performed on a set of ten DBA substrates that is attached to leads of a single leadframe. At this point in the manufacturing method, the leads have not yet been trimmed into individual leads but rather are parts of the single leadframe. In the diagram of FIG. 15, two flared end extensions of center lead 34 are shown having been ultrasonically welded to the sintered silver feature 21 on upper surface of plated metal island 7.

FIG. 16 is a circuit diagram of the half-bridge circuit of the assembly illustrated in FIG. 15. Semiconductor dice 23 and 24 are discrete N-channel power transistor dice. Bond pads 27 and 30 are gate terminals of the dice. Bond pads 28 and 29 are source terminals of the dice. The back side silver layer 25 of die 23 is the drain terminal of die 23. The back side silver layer 26 of die 24 is the drain terminal of die 24. No soft solder is used for die attach, nor to attach bond pads to leads.

Next, the set of ten DBA substrates is encapsulated at one time while the DBA substrates are still attached to the leadframe. Each DBA substrate is encapsulated with a separate amount of injection molded plastic. Reference numeral 2 identifies an amount of this encapsulant that encapsulates the DBA substrate 22 of FIG. 15. After encapsulation, lead trimming is performed to cut the leads from one another and from the leadframe. The result is ten individual finished DBA-based power devices, including packaged power device 1.

FIG. 17 is a perspective view of the finished DBA-based power device 1 after encapsulation and lead trimming. There is no soft solder anywhere under the block of encapsulant 2. Failures that might otherwise occur in severe −55° C. to +150° C. temperature cycling were soft solder bonding used for die attach are avoided due to the solderless, silver-to-silver die attach employed. Even though the silver nanoparticle paste was sintered at a relatively low temperature of 250° C., silver has a very high melting point of 961° C. The solderless silver-to-silver die attach bond is therefore remains strong even at high temperatures well above 200° C.

Figure 18:
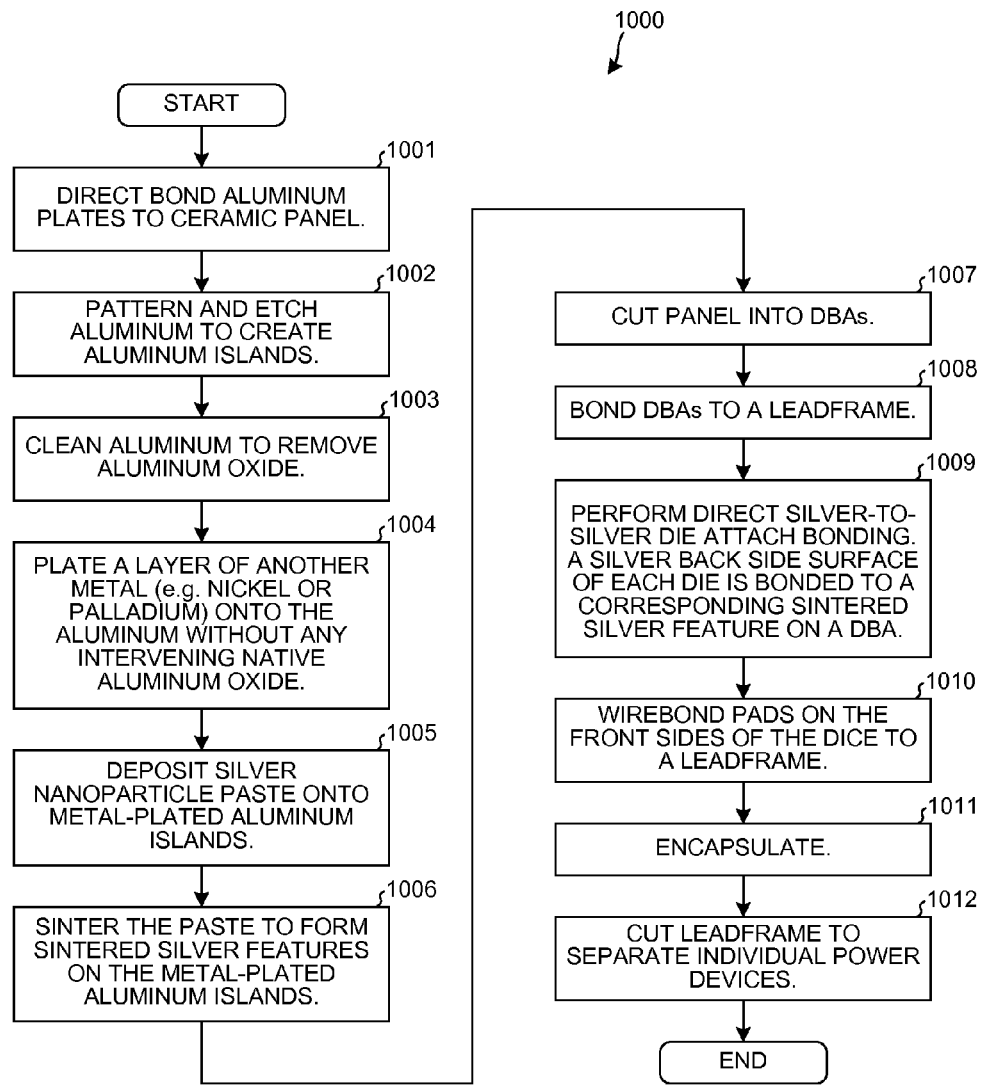
FIG. 18 is a flowchart of a method of making the packaged DBA-based power device of FIG. 17.

FIG. 18 is a flowchart of the method 1000 set forth in FIGS. 1-17 of making the DBA-based power device 1 of FIG. 17. Aluminum plates are direct bonded (step 1001) to a ceramic panel to make an aluminum-ceramic-aluminum sandwich structure. The aluminum plates are patterned and etched (step 1002) to create aluminum islands on the front side and the back side of the ceramic panel. After any native aluminum oxide is cleaned (step 1003) from the aluminum islands, the aluminum islands are plated (step 1004) with another metal. This other metal may be a five micron thick layer of nickel of palladium. In one example, there is substantially no native aluminum oxide disposed between the aluminum of the islands and the overlying plated metal. Silver nanoparticle paste is then deposited (step 1005) only onto selected parts of the metal plated aluminum islands. This step may be generally described as depositing silver nanoparticle paste on to selected parts of the metal plated aluminum islands of a DBA substrate, even through the actual DBA substrate at this point in the method is still part of the larger DBA panel assembly. Other parts of the DBA panel assembly that are not to be silvered do not receive silver nanoparticle paste in this step. The silver nanoparticle paste may be applied by screen printing or ink-jet printing onto the selected parts of the metal plated aluminum islands. The amount of silver consumed in this silvering process is less than were the entire surface of the panel assembly covered with evaporated silver, and then the silver were patterned and etched to remove much of the deposited silver. In the method of FIG. 18, the only silver deposited is silver that will become a useful part of the resulting DBA structures.

Next, the panel assembly is heated to sinter (step 1006) the silver nanoparticle paste, thereby forming sintered silver features on the selected parts of the aluminum islands. After sintering, the panel assembly is cut (step 1007) into a plurality of individual DBA substrates. Multiple DBA substrates are then secured (for example, by ultrasonic welding) to selected leads of a leadframe (step 1007). Direct silver-to-silver die attach bonding (step 1008) is then performed. The back side of each die includes a silver layer that was formed by evaporative deposition of silver onto the entire back side of the wafer prior to singulation of the wafer into individual dice. The top sides of the DBA substrates have corresponding sintered silver features. The silvered back side surfaces of the dice are pressed down onto the corresponding sintered silver features of the DBA substrates. Under suitable pressure and temperature each die is bonded to a DBA substrate with a solderless silver-to-silver bond. Next, bond pads on the front sides of the dice are bonded via aluminum bond wires to ends of corresponding other leads of the leadframe. In addition, bond wires may be provided between structures on a DBA substrate. For example, a bond pad on a die disposed on one aluminum island may be wirebonded directly to the other plated aluminum island of the DBA substrate as illustrated in FIG. 15. After wirebonding, each DBA substrate of the leadframe assembly is then encapsulated (step 1009) in an amount of injection molded plastic. Lead trimming is then performed (step 1010) to separate the leads from one another, thereby forming individual packaged DBA-based power devices.

Figure 19:
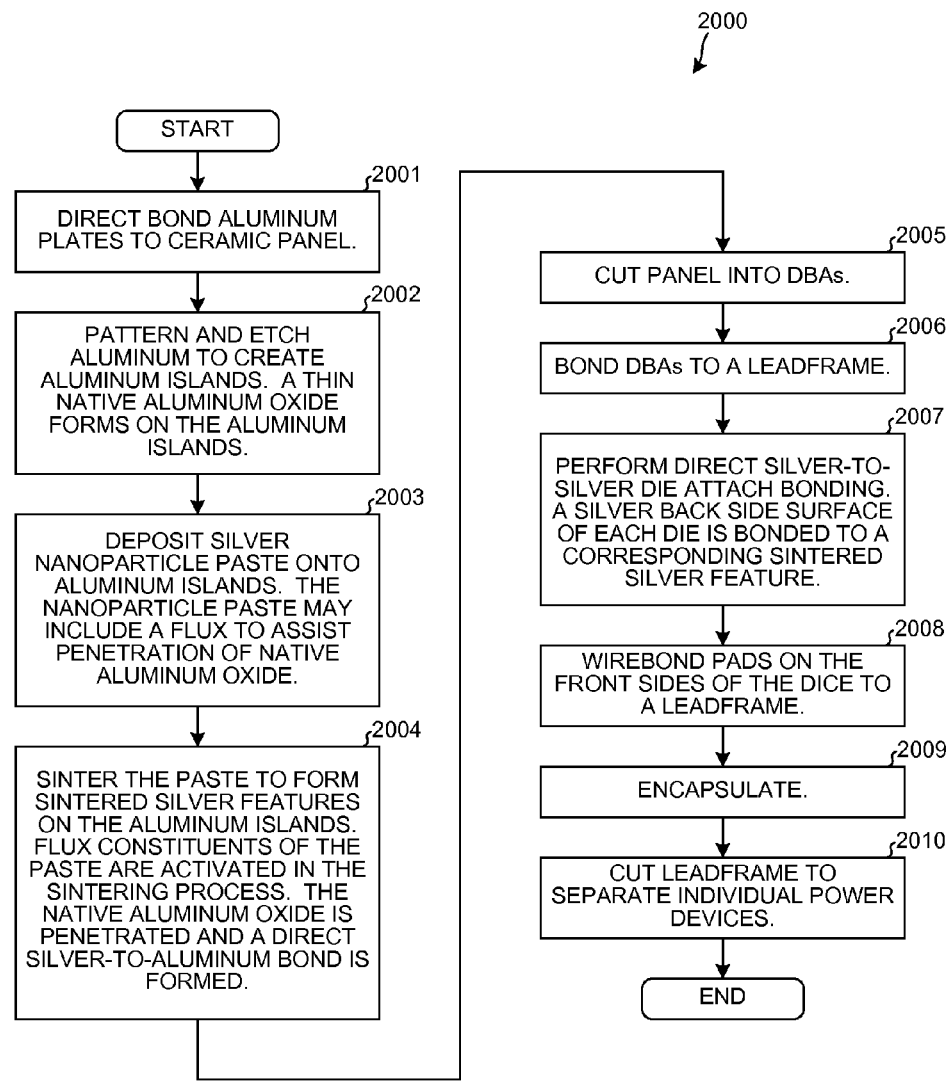
FIG. 19 is a flowchart of the second embodiment of a method of making the packaged DBA-based power device of FIG. 17.

FIG. 19 is a flowchart of another method 2000 of making a DBA-based power device. Aluminum plates are direct bonded to a ceramic panel (step 2001) and the aluminum plates are patterned and etched (step 202) as in the method of FIG. 18. Rather than then plating the aluminum islands with another metal (for example, nickel or palladium) as described above in connection with the method of FIG. 18, the aluminum islands are not plated with another metal. Rather, silver nanoparticle paste is deposited (step 2003) directly onto the aluminum islands. Due to this processing occurring in an air atmosphere, the aluminum islands are actually covered with a thin layer of a native aluminum oxide. More precisely then, the silver nanoparticle paste is deposited onto the thin native aluminum oxide layers that in turn are on the aluminum islands. After deposition of the silver nanoparticle paste, the individual volumes of nanoparticle paste are sintered (step 2004) to form individual sintered silver features on the aluminum islands.

In one example, the native aluminum oxide under a sintered feature remains largely in tact. Current flow into or out of the back side metal of each die passes laterally largely through the sintered silver feature rather than downward through the silver and into the aluminum. Due to the presence of the aluminum oxide layer, the underlying aluminum is not relied upon to carry current.

In another example, the native aluminum oxide is penetrated during the sintering process. Better electrical connection is then made between each sintered silver feature and the unoxidized aluminum of the underlying aluminum island. The native aluminum oxide layer is typically not entirely removed, but rather cracks are believed to form in the native aluminum oxide during the sintering process due to differential thermal expansion. Pressure and ultrasonic energy can be provided to promote this cracking. In some examples, the pressure and ultrasonic energy is applied only at the beginning of the sintering process. The cracks expose amounts of unoxidized aluminum. Bonding between the silver nanoparticles and the exposed aluminum occurs in these cracks.

In another example, the silver nanoparticle paste includes particles of a flux material. The flux particles are not active at room temperature, but under elevated temperatures of the sintering process the flux particles decompose into compounds such as acids. These compounds attack and help penetrate the native aluminum oxide. Pressure and ultrasonic energy can also be provided to promote cracking of the native aluminum oxide. Bonding between the silver nanoparticles and the exposed aluminum, and/or between the other constituents of the paste and the exposed aluminum, occurs in these cracks. The dispersant/binder and flux residue is then burned off or driven off as a consequence of the higher sintering temperatures at the end of the sintering process. After sintering, the panel assembly is cleaned to remove any flux residue that might still remain.

The panel assembly is then cut into DBA substrates (step 2005). The DBA substrates are bonded to a leadframe (step 2006), direct silver-to-silver die attach is performed (step 2007), wirebonding is performed (step 2008), encapsulation is performed (step 2009), and finally lead trimming is performed (step 2010) resulting in separate individual DBA-based power devices.

FIG. 20 is a table that sets forth the constituents of the silver nanoparticle paste used in one example of the method of FIG. 19. The listed weight percentages and temperatures are approximate.

Figure 22:
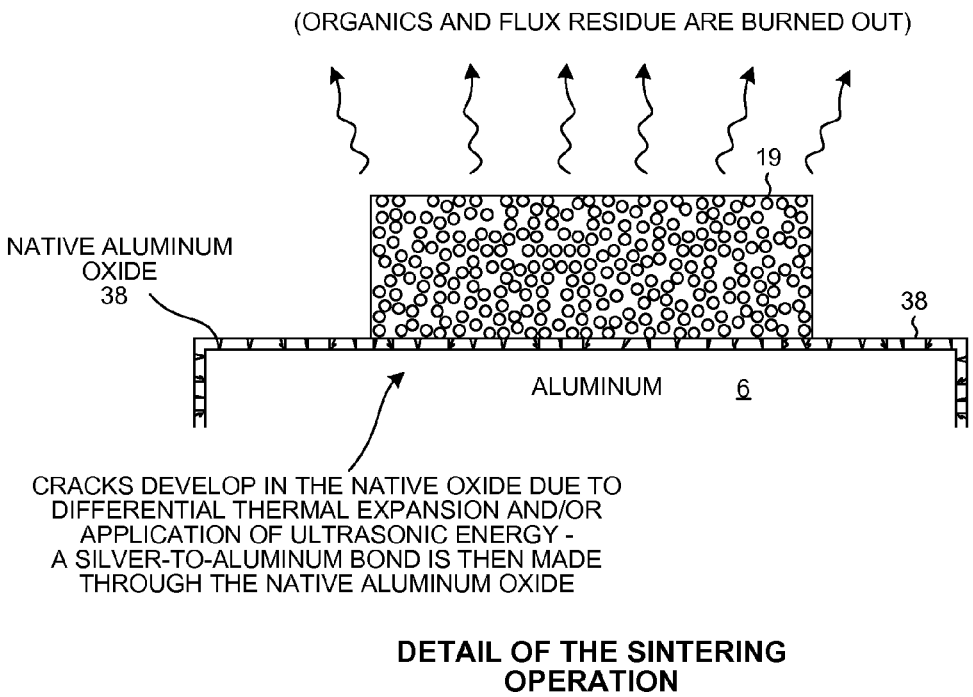
FIG. 22 is an illustration of the sintering of the volume of paste of FIG. 21.
Figure 23:
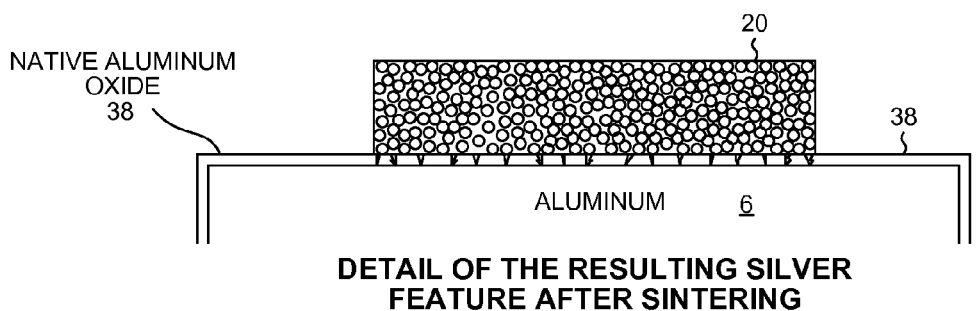
FIG. 23 is a simplified cross-sectional diagram of the sintered silver feature that results from the sintering of the volume of paste of FIG. 21.

FIGS. 21-23 illustrate three consecutive steps in the sintering process in which the silver nanoparticle paste of FIG. 20 is employed in the method of FIG. 19. In the simplified diagram of FIG. 21, the black circles represent particles of flux material. Reference numeral 37 identifies one such flux particle. The amount 19 of silver nanoparticle paste is disposed directly on the native aluminum oxide layer 38. The native aluminum oxide layer 38 in turn is on aluminum 6 on the top side of the DBA. FIG. 22 shows the structure of FIG. 21 after the sintering process has begun. The native aluminum oxide 38 is believed to be mechanically activated and crack due to differential thermal expansion such as between the aluminum 6 and the aluminum oxide 38. Pressure can be applied, and an initial amount of ultrasonic vibration used at temperature, to help mechanically disrupt the native aluminum oxide. The flux particles have decomposed into reactive agents that in turn assist in penetrating the cracks in the native aluminum oxide. Chemical reactions take place at the bottoms of the cracks between unoxidized aluminum and constituents of the decomposed flux. At elevated temperatures the flux residue and all other organics of the paste are burned out. As the temperature increases further to 250° C., the silver nanoparticles densify and sinter together to form the sintered silver feature.

FIG. 23 shows the resulting sintered silver feature 20. Native aluminum oxide quickly reforms on any exposed aluminum in the bottoms of the cracks. Accordingly, no cracks are illustrated in the diagram of FIG. 23 in the part of the native aluminum oxide that is not covered by feature 20. Good electrical contact exists between the sintered silver feature 20 and the underlying aluminum 6 of the island. The electrical connection is believed to exist through holes in the native aluminum oxide layer beneath the sintered silver feature.

Figure 24:
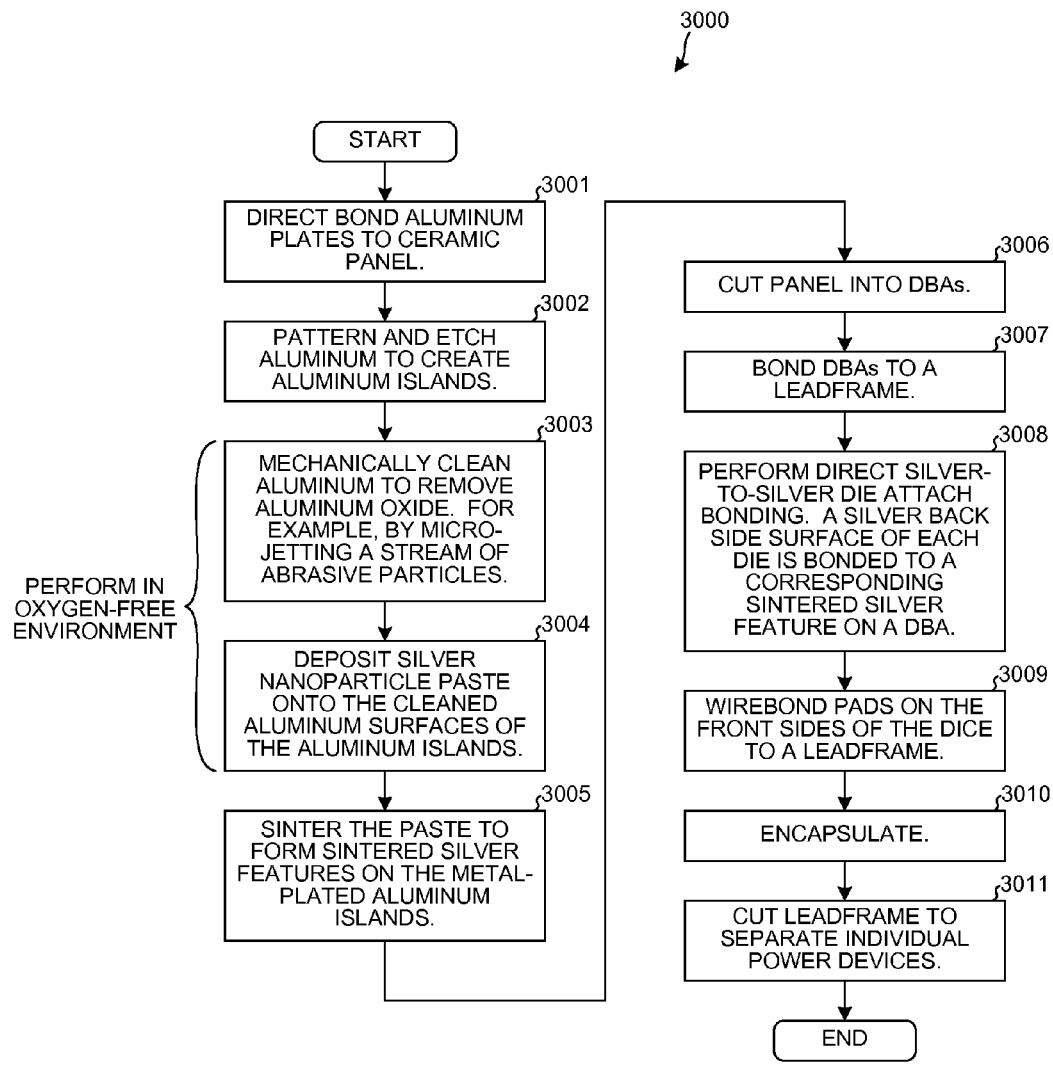
FIG. 24 is a flowchart of another method of making a DBA-based power device whereby native aluminum oxide is mechanically removed from localized areas of the aluminum islands (for example, by micro-jet blasting a stream of abrasive particles onto each area to be cleaned) and thereafter silver nanoparticle paste is deposited onto each such cleaned localized area.

FIG. 24 is a flowchart of another method 2000 of making the DBA-based power device of FIG. 17. Aluminum plates are direct bonded to a ceramic panel (step 3001) and the aluminum plates are patterned and etched (step 3002) as in the method of FIG. 18. Rather than then plating the resulting aluminum islands with another metal (for example, with nickel or palladium) as described above in connection with the method of FIG. 18, the panel assembly is placed in a chamber 41 that is substantially devoid of oxygen and moisture. In one example, the chamber has an atmosphere that is substantially entirely nitrogen. Next (step 3003), any native aluminum oxide that has formed on certain selected localized areas of the aluminum islands is mechanically removed.

Figure 25:
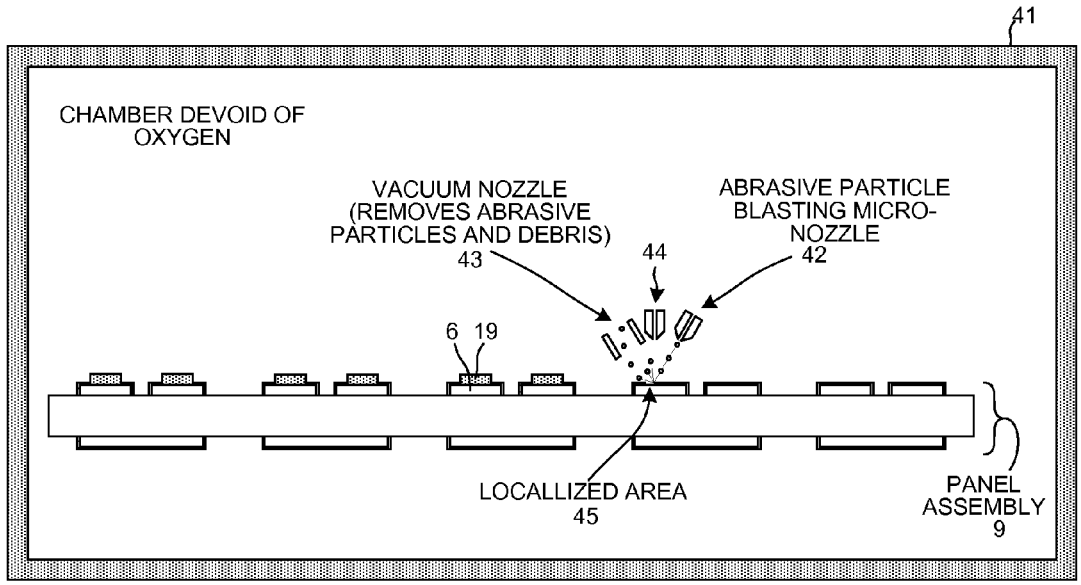
FIG. 25 is a cross-sectional diagram showing one way that a localized area on the top of an aluminum island can be mechanically cleaned of native aluminum oxide in the method of FIG. 24.

FIG. 25 is a cross-sectional diagram showing how this localized mechanical cleaning is carried out in one example. Two micro-nozzles 42 and 43 and a vacuum nozzle 44 are mounted to a micro-jet head. The micro-jet head is precisely controlled to move in the X, Y and Z dimensions as in known in the micro-jetting arts. Micro-nozzle 42 blasts a stream of abrasive particles with a suitable high velocity at the selected localized area 45 of the aluminum islands as shown. Vacuum nozzle 43 is positioned to remove the spent abrasive particles and other debris after the particles have hit the surface of the aluminum island. In this way a high velocity stream of abrasive particles mechanically blasts away the native aluminum oxide. The micro-nozzles are moved in the X, Y and Z dimensions to remove the native aluminum oxide from a desired localized area or areas of the aluminum islands. A layer of native aluminum oxide does not immediately regrow on the cleaned areas due to the entire panel assembly 9 being disposed in the oxygen-free environment in chamber 41.

Next in the method of FIG. 24, silver nanoparticle paste is deposited (step 3004) onto the cleaned aluminum surface or surfaces to cover the cleaned localized area. This deposition also occurs in the oxygen-free environment in chamber 41 such that the panel assembly is not subjected to oxygen between the time of native oxide removal until after the time of deposition of the silver nanoparticle paste.

Figure 26:
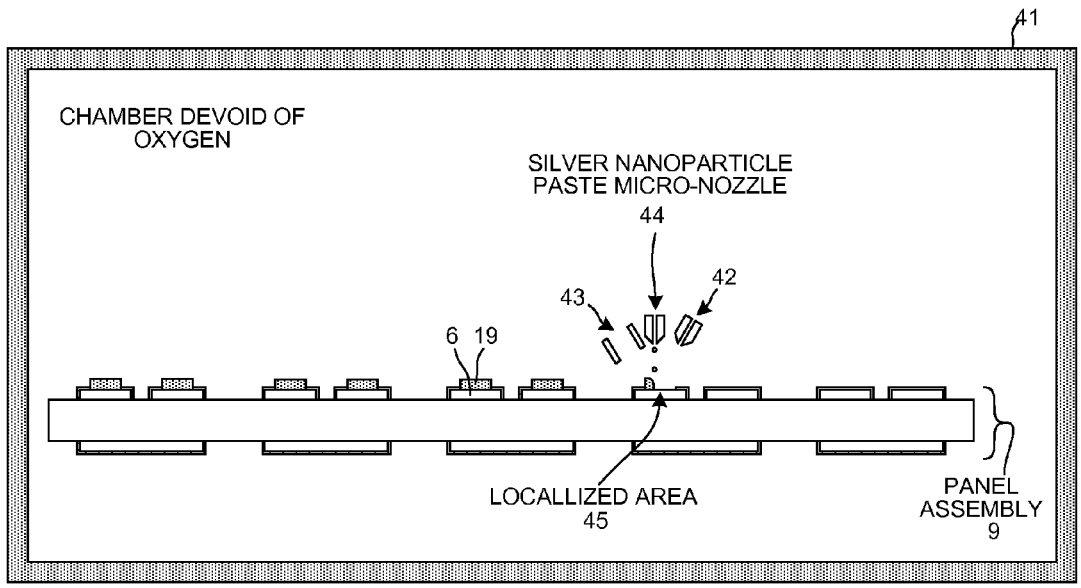
FIG. 26 is a cross-sectional diagram showing one way that silver nanoparticle paste can be deposited onto the mechanically cleaned localized area in the method of FIG. 24.

FIG. 26 is a cross-sectional diagram showing how the silver nanoparticle paste is deposited in one example. Micronozzle 44 micro-jets a stream of small microdots of nanoparticle paste onto the cleaned localized area or areas of the aluminum island or islands. In one example, all such areas that are later to receive nanoparticle paste are cleaned in step 3003, and thereafter the silver nanoparticle paste is applied to all those areas in step 3004. In another example, one area is cleaned in step 3003 without all such other areas on the panel assembly being cleaned, and thereafter nanoparticle paste is deposited onto the one cleaned area in step 3004, and then these two steps are repeated for the next area to be silvered, and so forth. Regardless of the order of cleaning and applying silver nanoparticle paste to the various areas to be silvered, the deposited volumes of paste are then sintered (step 3005) to form the sintered silver features on the aluminum islands. Each of the resulting sintered silver features is at least in part disposed directly on aluminum without intervening aluminum oxide being disposed between the sintered silver and the underlying aluminum of the aluminum island. The panel is then cut into individual DBA substrates (step 3006). DBA substrates are bonded (step 3007) to a leadframe, direct silver-to-silver die attach bonding is performed (step 3008), wirebonding is performed (step 3009), encapsulation is carried out (step 3010), and the leadframe is cut (step 3011) thereby forming separate individual DBA-based power devices.

To reduce the amount of time required to carry out the cleaning and paste depositing steps, in one example the micro-jet equipment involves multiple pairs of abrasive and paste depositing nozzles, where the cleaning nozzle of each pair performs its cleaning task on a corresponding localized area at the same time that the cleaning nozzles of the other pairs clean other localized areas. Thereafter the depositing nozzle of each pair performs its depositing task on a corresponding localized area at the same time that the depositing nozzles of the other pairs deposit onto other localized areas. The various pairs of nozzles therefore operate in parallel on different localized areas. A gas pump creates a gas flow through chamber 41. This flow of gas carries debris of the abrasion away from the cleaned surfaces. The abrasive particle material is a dust or a sand involving alumina powder, silica, or another clean sand blasting powder. If an entire aluminum surface needs to be coated with the silver nanoparticle paste (for example, the back side of a chip or a substrate), then a simple tool with a small brush or rotating file may be used to strip the native aluminum oxide, followed immediately by depositing of the silver nanoparticle paste, and followed by firing of the paste to form the desired sintered silver features. In one example, rather than removing a localized area of native aluminum oxide using abrasive particles as described above, the cleaning micro-nozzle applies a mildly reactive cleaning liquid (for example, a mildly acidic liquid) to the localized area in order to etch away or to penetrate the native oxide. This application is followed by an inert clean cycle that washes off the cleaning liquid and the residues, thereby readying the cleaned surface for nanoparticle paste deposition.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   (a) performing a direct silver-to-silver bonding of a silver surface of a semiconductor die to a silver surface of a sintered silver layer, wherein the sintered silver layer is a part of a Direct-Bonded Aluminum (DBA) substrate, wherein the DBA substrate comprises a ceramic portion, an aluminum layer disposed on the ceramic portion, and the sintered silver layer, and wherein the direct silver-to-silver bonding involves pressing the silver of the silver surface of the die directly onto the silver surface of the sintered silver layer without any intervening soft solder.

2. The method of claim 1, wherein the DBA substrate further comprises a layer of plated metal disposed between the aluminum layer and the sintered silver layer.

3. The method of claim 2, wherein the layer of plated metal is a layer taken from the group consisting of: a nickel layer, and a palladium layer.

4. The method of claim 1, wherein the sintered silver layer is disposed directly on the aluminum layer of the DBA substrate, wherein there is substantially no native aluminum oxide disposed between the sintered silver layer and the aluminum layer.

5. The method of claim 1, wherein the DBA substrate further comprises a layer of native aluminum oxide disposed between the sintered silver layer and the aluminum layer of the DBA substrate.

6. The method of claim 1, further comprising:
   (b) applying a silver nanoparticle paste onto a layer of plated metal, wherein the layer of plated metal is disposed over the aluminum layer; and
   (c) sintering the silver nanoparticle paste thereby forming the sintered silver layer, wherein steps (b) and (c) occur before step (a).

7. The method of claim 6, wherein the layer of plated metal is a layer taken from the group consisting of: a nickel layer, and a palladium layer.

8. The method of claim 1, further comprising:
(b) applying a silver nanoparticle paste directly onto the aluminum layer such that there is substantially no native aluminum oxide disposed between the silver nanoparticle paste and the aluminum layer; and
(c) sintering the silver nanoparticle paste thereby forming the sintered silver layer, wherein steps (b) and (c) occur before step (a).

9. The method of claim 1, further comprising:
(b) mechanically removing an amount of native aluminum oxide from the aluminum layer;
(c) after (b) applying a silver nanoparticle paste directly onto the aluminum layer such that there is substantially no native aluminum oxide disposed between the silver nanoparticle paste and the aluminum layer; and
(d) sintering the silver nanoparticle paste thereby forming the sintered silver layer, wherein steps (b), (c) and (d) occur before step (a).

10. The method of claim 9, wherein step (b) of mechanically removing the amount of native aluminum oxide involves micro-jetting a stream of abrasive particles.

11. The method of claim 1, further comprising:
(b) applying a silver nanoparticle paste onto a layer of native aluminum oxide, wherein the layer of native aluminum oxide is disposed on the aluminum layer; and
(c) sintering the silver nanoparticle paste thereby forming the sintered silver layer, wherein steps (b) and (c) occur before step (a).

12. The method of claim 1, wherein the direct silver-to-silver bonding involves:
pressing the silver surface of the die into the sintered silver layer under a weight of at least one kilogram; and
heating the silver surface of the die and the sintered silver layer to at least two hundred fifty degrees Celsius.

13. A method comprising:
depositing an amount of a silver nanoparticle paste on a Direct-Bonded Aluminum (DBA) structure, wherein the DBA structure includes a ceramic portion, an aluminum layer that is direct bonded to the ceramic portion, and a thin native aluminum oxide layer disposed on the aluminum layer;
sintering the silver nanoparticle paste such that silver particles in the paste are sintered to form a sintered silver structure, wherein the sintering also causes the thin native aluminum oxide layer to be penetrated in at least some locations such that a direct silver-to-aluminum connection is formed between the sintered silver structure and at least some parts of the aluminum of the aluminum layer of the DBA structure; and
performing solderless silver-to-silver die attach bonding by placing a silver surface of a die directly onto a silver surface of the sintered silver structure without any intervening soft solder such that the silver surface of the die fuses to the silver surface of the sintered silver structure.

14. The method of claim 13, wherein the silver nanoparticle paste includes a compound, and wherein the compound decomposes at a temperature above room temperature thereby forming an acid.

15. The method of claim 13, wherein the sintering involves applying ultrasonic energy to the thin native aluminum oxide layer.

16. A method comprising:
micro-jetting abrasive particles at a Direct-Bonded Aluminum (DBA) structure thereby removing an amount of native aluminum oxide from an aluminum layer of the DBA structure so that a cleaned aluminum surface results;
micro-jetting an amount of a silver nanoparticle paste onto the cleaned aluminum surface such that there is direct contact between the silver nanoparticle paste and aluminum of the cleaned aluminum surface;
sintering the amount of silver nanoparticle paste such that silver particles in the paste are sintered to form a sintered silver structure; and
forming a solderless silver-to-silver die attach bond between a silver surface of a die and a silver surface of the sintered silver structure without using soft solder such that the silver surface of the die fuses directly to the silver surface of the sintered silver structure.

17. The method of claim 16, wherein there is substantially no native aluminum oxide disposed between the silver nanoparticle paste and the aluminum layer of the DBA structure.

18. A method comprising:
(a) applying a silver nanoparticle paste onto a layer of plated metal, wherein the layer of plated metal is disposed over an aluminum layer of a Direct-Bonded Aluminum (DBA) substrate;
(b) forming the sintered silver layer of the DBA substrate by sintering the silver nanoparticle paste, wherein the DBA substrate comprises a ceramic portion, the aluminum layer disposed on the ceramic portion, the layer of plated metal and the sintered silver layer; and
(c) bonding a silver surface of a semiconductor die to the sintered silver layer without using solder such that a solderless silver-to-silver bond forms between the silver surface and the sintered silver layer.

19. The method of claim 18, wherein the layer of plated metal is a layer taken from the group consisting of: a nickel layer and a palladium layer.

20. The method of claim 18, wherein the bonding in (c) involves:
pressing the silver surface of the semiconductor die into the sintered silver layer under a weight of at least one kilogram; and
heating the silver surface of the semiconductor die and the sintered silver layer to at least two hundred fifty degrees Celsius.

21. The method of claim 18, wherein the silver nanoparticle paste is micro-jetted onto the layer of plated metal.

* * * * *